United States Patent [19]

Street

[11] 3,988,610
[45] Oct. 26, 1976

[54] DIGITIZING OF RECORDED DATA

[76] Inventor: Graham Stewart Brandon Street, 115 Perse Way, Cambridge, England

[22] Filed: Feb. 20, 1975

[21] Appl. No.: 551,567

[30] Foreign Application Priority Data
Feb. 21, 1974 United Kingdom.............. 7836/74

[52] U.S. Cl................................. 250/202; 250/556
[51] Int. Cl.² ..................... G05B 1/00; G06K 5/00
[58] Field of Search ........... 250/202, 556; 318/594, 318/640

[56] References Cited
UNITED STATES PATENTS
3,651,392  3/1972  Frisch et al. ..................... 318/640
3,883,735  5/1975  Murphy et al. .................... 250/202
FOREIGN PATENTS OR APPLICATIONS
1,324,241  7/1973  United Kingdom ................ 250/556

Primary Examiner—Harold A. Dixon
Assistant Examiner—David K. Moore
Attorney, Agent, or Firm—Woodhams, Blanchard and Flynn

[57] ABSTRACT

In a reading machine in which a record such as a film record is read by scanning with a monitoring beam which is then detected by a photo-sensor, a sheet of photo-sensitive material is placed against the record and after each part of the record has been read it is traced with an activating beam which activates the photo-sensitive material and thus changes the color or density of the line as seen when the combination of the record and the photo-sensitive film is observed. The part of the record which has been read can thereby be distinguished easily from that which is still to be read, eliminating risk of re-reading.

15 Claims, 4 Drawing Figures

DIGITIZING OF RECORDED DATA

The present invention relates to the reading of a record by means of a monitoring beam of radiation which scans the record to determine the position of elements of the record by observation of variations in intensity of the beam transmitted by or reflected from the record. These variations in intensity can be detected photoelectrically and the position information, which usually represents the positions of points at intervals along the lines of the record, can be subjected to analysis and used in effecting and controlling operations.

Apparatus for reading records in this way is known and usually uses mirrors for steering the monitoring beam, the mirrors being controlled to generate, for example, a raster scan of the beam over an area of the record by means of which a line extending across that area can be detected. Laser beams can conveniently be used and the intensity variations imposed on the monitoring beam by the record can be detected by a photocell or photo-multiplier.

One example of such a reading apparatus is the track-following machine described in U.S. Pat. No. 3,651,392 and the corresponding British patent specification No. 1,286,809. In that machine, instead of using a raster scan, the beam executes a small circular scan to detect the direction of a track and the steering mirrors are controlled to cause the monitor beam to follow the track on the record. In British patent specification No. 1,324,241 there is described apparatus using a steered light beam for recording information and the way in which the apparatus may be used for reading a record is described in U.S. patent application Ser. No. 310,679, filed Nov. 30, 1972, under the title "Light-beam steering apparatus."

The reading operation can be controlled wholly or in part by an operator who is able to observe the record and position the monitor beam on the record before initiating the reading operation. Alternatively the whole operation can be controlled automatically. In either case there is a risk that parts of the record may be read more than once because the operator or the automatic control system is unable to remember which parts have already been read. In theory, of course, an automatic control system can be designed to "remember", that is to store, information concerning the lines which have been read and to recognize whether a line has or has not been read but in practice this requires very sophisticated computer control programs which would be very expensive.

In accordance with the present invention there is provided a method of reading a record in which the recorded information is in the form of a lighter line or lines on a darker background, wherein a sheet of photosensitive material is placed against the record, the record is read by means of a monitor beam which is transmitted or reflected by the line or lines more than the background and which is transmitted by the photosensitive material without causing activation of the photosensitive material, and after each line or part of a line has been read it is traced with an activating beam which activates the photosensitive material to change the color or density of the line when the record and photosensitive material are viewed in combination, whereby the line or part line which has been read and those which have not can be distinguished from one another.

This method can be carried out by the use of apparatus in accordance with the invention comprising means for generating a monitor beam which is transmitted or reflected by the line or lines more than by the background, means for steering the monitor beam to read the record and means for storing the information derived from the reading operation, means for generating an activating beam having a separate frequency or frequency range from that of the monitor beam such that the activating beam is capable of activating a sheet of photosensitive material which is not sensitive to the monitor beam and which is placed against the record, and means for driving the activating beam under the control of the stored information to follow a line or part line which has been read by the monitor beam and thereby activate the photosensitive material.

The record is conveniently in the form of a photographic film, in which case it can be read by transmitted light. The photosensitive material is preferably a photo-chromic film. The photosensitive material can be chosen such that when activated it causes the line traced to match the background and thus disappear from view or such that it causes the line traced to appear against the background either as a line of different density, i.e., a lighter or darker line, or as a line of different color from the lines which remain to be read.

The same optical system can be used for steering the monitor beam and driving the activating beam, which can be beams of different wavelengths generated by a single laser or by separate lasers. The monitor beam is preferably caused to execute a raster scan over an area of the record, in which case position information is obtained by determining the point in the scan at which a line is crossed and there is a consequent increase in intensity of the monitoring beam at the detector. Alternatively the detector may be used to cause the monitor beam to follow a line, as in British specification No. 1,286,809, referred to above, and the position of the beam is then recorded at intervals.

In a preferred form of the apparatus the steering optical system consists of a main deflector system comprising two deflecting mirrors for X and Y co-ordinate deflections and an auxiliary deflection system which may be an electro-optical device or may be a pair of small fast-moving mirrors. Such a system is described in British patent specification No. 1,324,241 and for driving the activating beam may be controlled exactly as described in that specification. For steering the monitoring beam the main deflection system can be used to move the beam to required starting positions on the record and the auxiliary deflection system can then be used with the main deflection system to generate a raster scan.

Whereas movement of the monitoring and activating beams has been described it will be appreciated that the record may be moved instead.

The invention can be employed when it is required to translate a drawing or document (e.g., engineering drawing, map, electronic circuit) into a set of co-ordinate points and other information which may be stored and processed in a computer, and which can be used to regenerate the original or modified drawing or document on some form of draughting or writing device. This translation or digitization is normally done on a digitizing machine, which, depending on its sophistication, needs a degree of operator assistance.

One method of digitization involves the use of a film record of the original drawing or document. The presence of a line or feature is detected by shining a light beam at the film and having a light detector positioned behind it. The change of light transmission on scanning the light across the region containing the line is used to locate the line.

A major practical difficulty encountered during the digitization of any complex record lies in knowing which parts of the record have already been digitized. Time can easily be wasted in digitizing some features more than once. In automated, computer-controlled systems a large part of the memory and a considerable amount of computing time needs to be allocated to avoiding repetition and to knowing when digitization is complete.

The invention will be described in more detail with the aid of an example illustrated in the accompanying drawings, in which.

Figure 1:
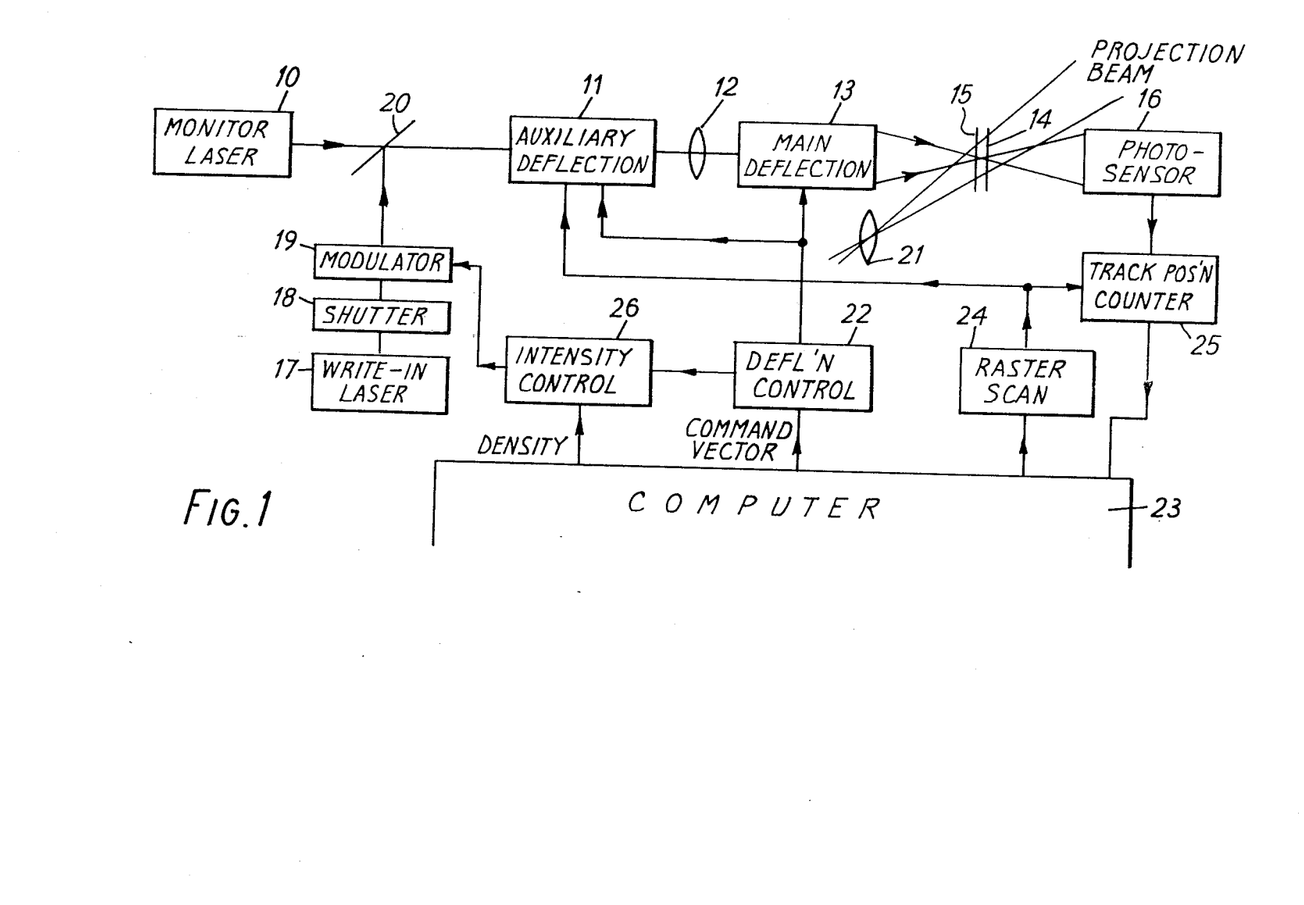
FIG. 1 is a block diagram of a reading apparatus in accordance with the invention, FIG. 2 gives a more detailed circuit diagram for the line position circuit of FIG. 1.

The reading apparatus shown in FIG. 1 comprises a monitor laser 10 from which a monitoring beam passes through an auxiliary deflection device 11, a lens 12 and a main deflection device 13 to fall on a film record 14. In front of the record 14 is a sheet of photochromic film 15. The monitoring beam passes through the photochromic film 15 and the record 14 to fall on a photo-sensor 16 which is in the form of a photo-multiplier. A "write-in" laser 17 generates a write-in laser beam of a wavelength different from that of the monnitoring beam. The write-in passes from the laser 17 by way of a mechanical shutter 18, a modulator 19 and a partially reflecting mirror 20 to the auxiliary deflection device 11 and from there through the lens 12 and main deflection device 13 to fall on the photo-chromic film 15. The wavelength of the write-in beam is such that it will activate the photo-chromic film and hence it is also referred to in this specification as an activating beam. The wavelength of the monitoring beam, on the other hand, must be such that it is transmitted by the lines of the record on the film record 14 and is also transmitted by the photo-chromic film 15 without causing activation of the film. For examination of the record by the operator a projection beam is directed through the photo-chromic film 15 and film record 14 from the rear and a projection lens 21 casts an image on a viewing screen.

The main deflection device 13 consists of a pair of steering mirrors, one for X co-ordinate deflection and the other for Y co-ordinate deflection. The auxiliary deflection device 11 similarly consists of X and Y co-ordinate deflectors and these may either be small mirrors or electro-optical devices. The auxiliary deflection device provides a high-speed correction over a small range to the position established by the main deflection device which has greater inertia and thus may reach the correct position more slowly. Both deflection devices are controlled by the same error signal from a deflection control circuit 22. Further details of the auxiliary deflection device 11, main deflection device 13 and deflection control circuit 22 can be found in British patent specification No. 1,324,241.

For steering the monitoring beam the auxiliary and main deflection devices co-operate the control the large scale movements of the beam across the film record 14. A command vector applied to the deflection control circuit from a computer 23 under operator or automatic control results in movement of the beam in the required direction. For locating lines of the record a rapid, repeated scan in one co-ordinate direction is superimposed on the overall movement of the beam by means of a raster scan circuit (time base circuit) 24 which controls the auxiliary deflection device 11. Thus, if the overall movement of the beam is in the Y co-ordinate direction and the rapid scan is effected in the X co-ordinate direction, a rectangular raster scan pattern will be executed. In general, however, the overall movement will be a vector close to the general direction of the line being followed and the rapid scan will not be perpendicular to this vector.

The lines of the film record 14 are lighter than the background and transmit the monitor beam when it crosses them. The transmitted beam falls on the photo-sensor 16 which generates a pulse each time a line is crossed. The pulses from the photo-sensor 16 and the output of the raster scan circuit 24 are applied to a track position counter or line position indicator circuit 25 which determines the positions of points at which lines of the record are crossed and feeds these to the computer 23. There is thus built up in the computer a digitized version of the information contained in the film record 14.

While the monitoring beam is being used to generate the digitized information, the mechanical shutter 18 is kept closed to render the activating beam completely inoperative. After a part of the record has been digitized the shutter 18 is opened and the information in the computer 23 is used, by way of the deflection control circuit 22, the auxiliary deflection device 11 and the main deflection device 13, to steer the activating beam along the track which has been digitized. The activating beam thus activates the photo-chromic film 15 along a track which is directly superimposed on the track on the record 14 and when the two are viewed by means of the projection system the part of the track which has been traced by the activating beam is easily differentiated from the part which has still to be scanned by the monitoring beam by reason of a difference in color or density.

When the activating beam is being used to trace over a line which has been digitized it is important to ensure that its action on the photo-chromic film 15 produces a trace of uniform density. It is therefore necessary to control the action of the activating beam in dependence upon the velocity with which it is swept across the photo-chromic film and for this purpose the modulator 19 is controlled by an intensity control circuit 26 which is supplied with a velocity signal from the deflection control circuit 22 and with a density signal from a computer 23, the latter determining the overall density of the record. As will be described in more detail below the modulator 19 and intensity control circuit 26 so control the activating beam that it acts upon the photo-chromic material at closely-spaced points determined by a "bright-up" signal whose timing varies according to the velocity of tracing to produce dots which are equally-spaced along the track.

Figure 2:
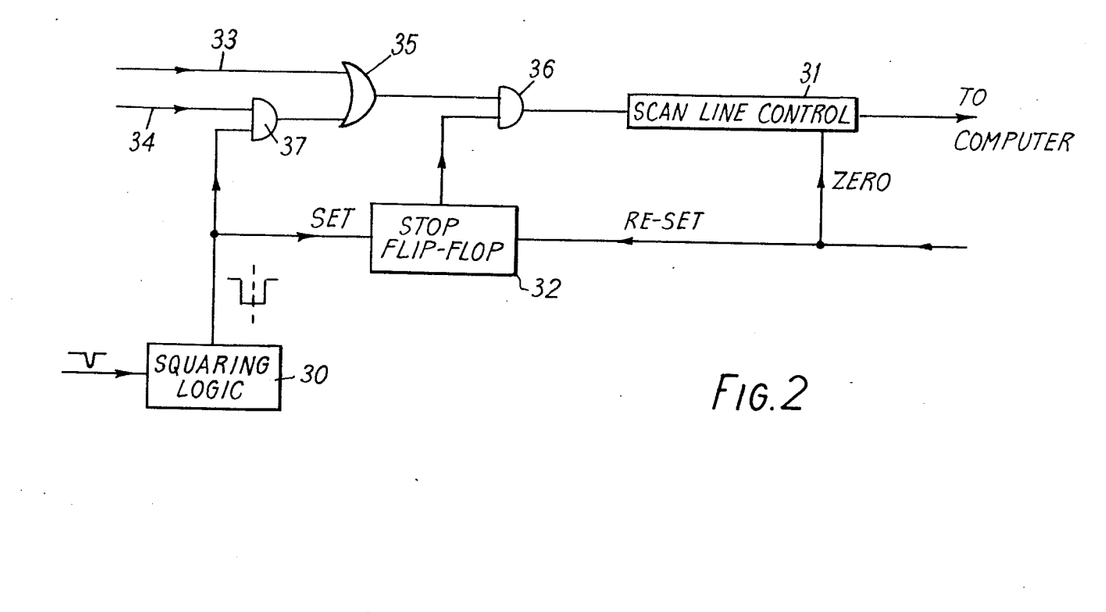

FIG. 2 shows the circuit of the line position indicator 25. The pulses from the photo-sensor 16 are applied to a squaring logic circuit 30 which converts them into square pulses. At the beginning of each line of the scan, the raster scan circuit 24 supplies a signal which returns a scan line counter 31 to zero and at the same time re-sets a stop flip-flop 32. During the course of a single line scan, the raster scan circuit 24 supplies a regular series of pulses which appear alternately on lines 33 and 34. At the beginning of a line of the scan these pass by way of OR gate 35 and AND gate 36 to the counter 31. When the front edge of a squared pulse from circuit 30 reaches an AND gate 37, the pulses on the line 34 are inhibited and the rate of counting is thus halved. The trailing edge of the squared pulse sets the stop flip flop 32 to a condition in which it inhibits the gate 36 and thus stops the count. The resulting count in the counter 31 represents the position of the mid-point of the line crossed by the scanning beam because counting continued across the full width of the line but at half rate. This information is then transmitted to the computer.

The intensity modulator 19 may be a Pockel cell in combination with a Wollaston prism which splits the laser beam into two components with different polarizations which follow slightly different paths. One component is used as the activating beam and its intensity is modulated by rotating the plane of polarization of the incident beam by means of the pocket cell and thereby varying the distribution of energy between the two components. Alternatively, the modulator may be an acousto-optic modulator which uses ultrasonic vibrations to control the refraction of the beam by a block through which it is transmitted and thereby changes the proportion of the beam transmitted by a stop.

Figure 3:
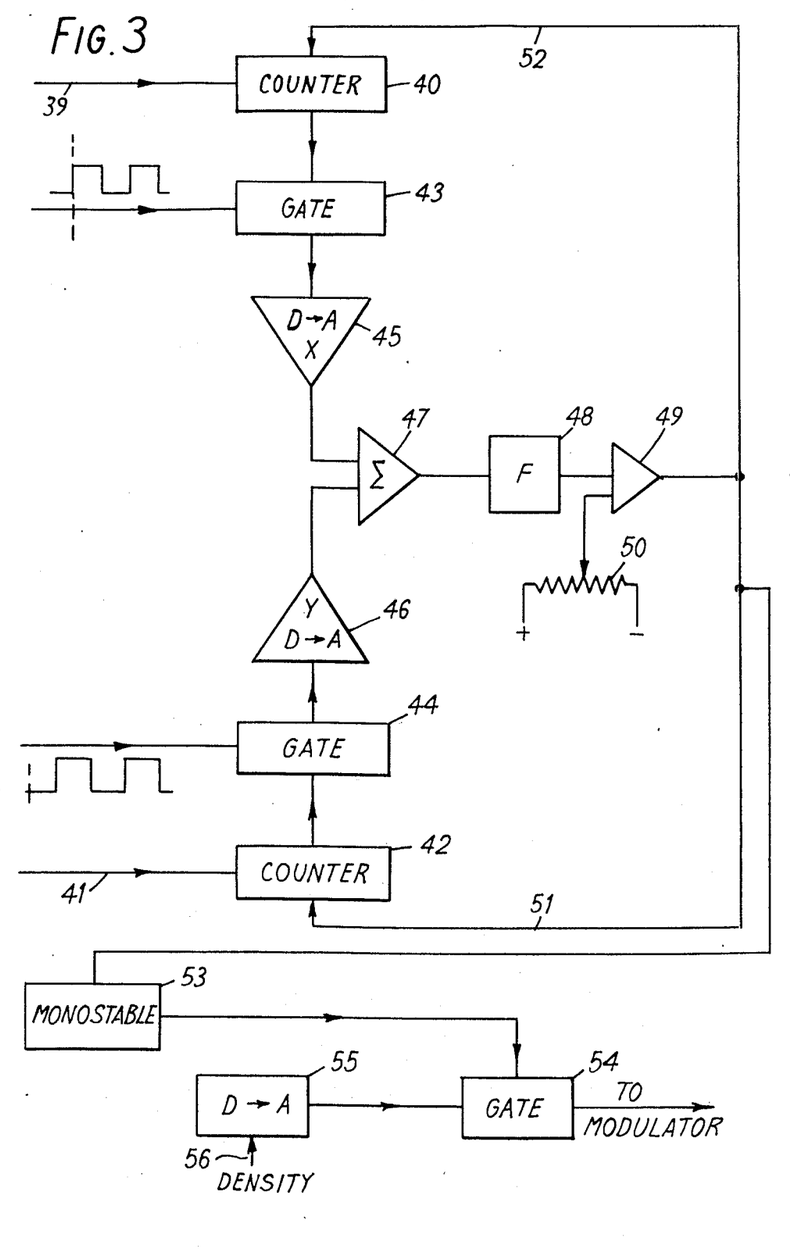
FIG. 3 is a block circuit diagram of the intensity control circuit of FIG. 1.

The intensity control circuit 26 is shown in FIG. 3. It has to take into account the actual movement of the activating beam across the photo-chromic film 15 and for this purpose is supplied with move control pulses from the deflection control circuit 22 representing both the X and Y movements of the beam. Thus X-deflection output pulses from the control circuit 22 are supplied by a line 39 to a 4-bit counter 40 of type SN 7493N. These pulses represent by their number and rate the extent and rate of movement commanded in the X-direction and thanks to the action of the secondary deflection system it can be assumed that the beam moves exactly in accordance with these commands. The count in the counter 40 thus represents the extent or magnitude of the X-deflection. Similarly, the parallel mirror control circuit for the Y-deflection delivers move control pulses on a line 41 to a counter 42, also of type SN7493N. The counters 40 and 42 are connected through respective gates 43 and 44 to an X-digital-to-analogue converter 45 and a Y digital-to-analogue converter 46, respectively. The gates 43 and 44, of type 7408, are controlled by gate pulses in the form of a square wave of frequency $\omega$, the gate pulses to the two gates being 90° out of phase.

The counts in the counter 40 and 42 represent displacements $\frac{1}{3}X$ and $\frac{1}{3}Y$ of the mirrors of the main deflection device 13. Because these two mirrors are at different distances from the surface of the film 15 the actual displacements of the beam across the surface can be represented as $\sqrt{a}\, \Delta X$ and $\sqrt{b}\, \Delta Y$ giving a resultant of magnitude of $\sqrt{a\,(\Delta X)^2 + b\,(\Delta Y)^2}$. The appropriate resultant magnitude is obtained in the circuit of FIG. 3 by summing a sine wave of amplitude $\sqrt{a}\, \Delta X$ and a cosine wave of amplitude $\sqrt{b}\, \Delta Y$. The sine and cosine terms are provided by the gates 43 and 44 and the amplitudes are set by the digital-to-analogue converters 45 and 46, which have variable gain. The two analogue signals are then combined by a summing amplifier 47 and put through a filter 48 tuned to the frequency $\omega$ of the gating pulses. The output from the filter 48 is thus the sum of the first order harmonics $\sqrt{a}\, \Delta X \sin\omega + \sqrt{b}\, \Delta Y \cos\omega$ of the square waves having the required amplitude of $\sqrt{a\,(\Delta X)^2 + b\,(\Delta Y)^2}$. This is applied to a sense amplifier 49 which has a threshold value set by a potentiometer 50. This threshold value is set such that when the beam has moved a distance across the surface of the film 15 less than the size of the activating beam, typically $16\mu$ ($16 \times 10^{-6}$ meter), the sense amplifier 49 triggers and, if a recording is required at that point by the controlling signals from the computer 23, a bright-up pulse is applied to the modulator 19. When the sense amplifier 49 triggers it resets the counters 40 and 42 by way of the lines 52 and 51. Hence a bright-up pulse is issued on the completion of each step of $12\mu$ in the movement of the beam across the photochromic film. Dots are recorded at uniform intervals to produce a line of uniform intensity along its length.

The trigger signal from the sense amplifier 49 sets a monostable 53 which controls the length of the bright-up pulse. The output from the monostable 53 is applied to control a gate 54. The input to the gate is provided by a digital-to-analogue converter 55 in dependence upon the density signal on a line 56 from the computer. Thus, the amplitude of the bright-up pulse is varied to control the density of the trace on the photochromic film. The output of the gate 54 passes to the modulator 19.

Figure 4:
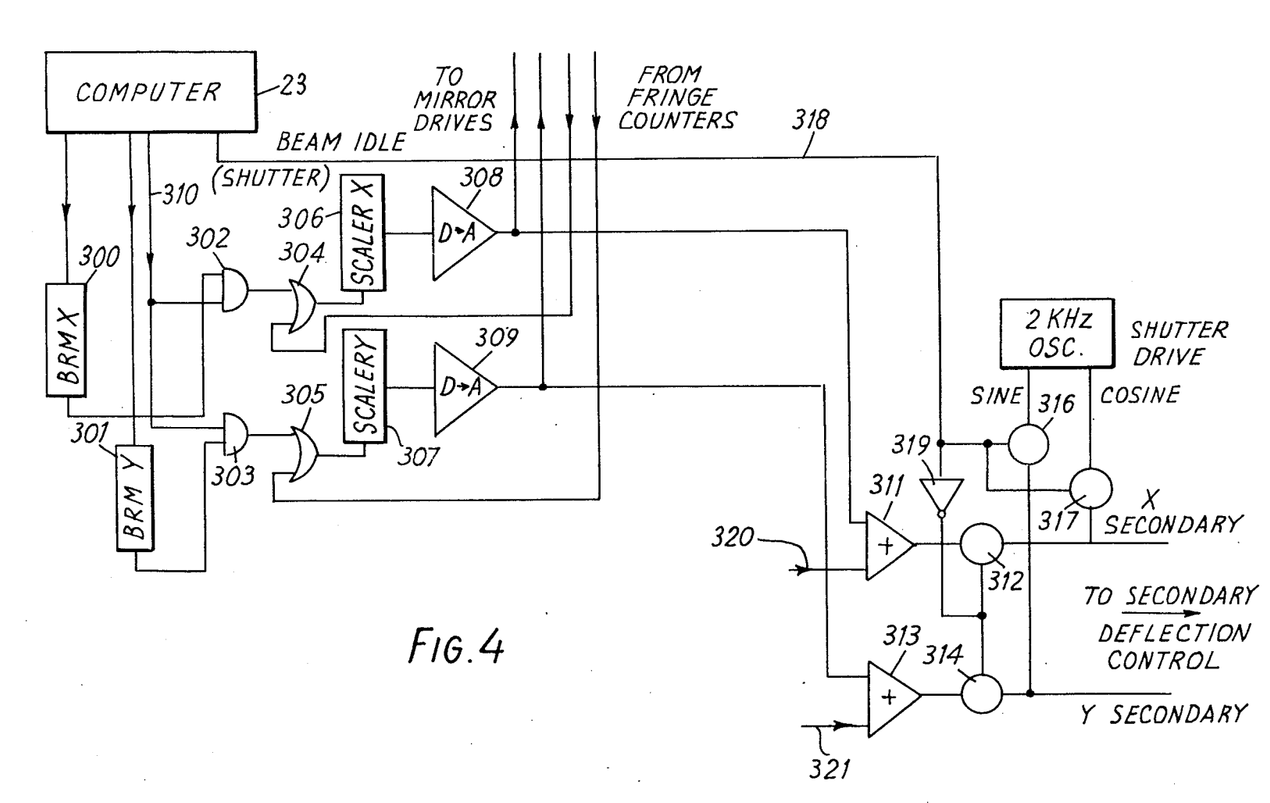
FIG. 4 is a block circuit diagram of the deflection control circuit of FIG. 1 with an electronic shutter system.

FIG. 4 shows details of the deflection control circuit 22 of FIG. 1 with an added circuit for controlling the activating beam by means of the auxiliary deflection device to execute a small circular scan. By introducing in the path of the activating beam a diaphragm of smaller diameter then the circular scan, a form of quick-acting electronic shutter is obtained for interrupting the activating beam when for a short time activation of the photochromic film is not required. FIG. 4 gives an outline circuit for the control of both X and Y deflections. The computer 23 supplies command vector components to a B.R.M. (binary rate multiplier) 300 for the X-deflection and a B.R.M. 301 for the Y-deflection. The outputs from the B.R.M.s 300 and 301 pass by way of gates 302 and 303, respectively, to OR gates 304 and 305, respectively, which also receive inputs from corresponding fringe counters which measure the positions of the main deflecting mirrors. The gates 304 and 305 feed error scalers 306 and 307 for the X and Y deflectors, respectively. The error scalers 306 and 307 control the mirror drives for the main deflecting mirrors by way of respective digital to analogue converters 308 and 309 whose outputs are also applied to the secondary deflection control circuits.

The output from the digital-to-analogue converter 308 is passed to the X secondary control circuit by way of a summing amplifier 311 and a switch 312. Similarly, the output of the digital-to-analogue converter 309 is passed to the Y secondary control circuit by way of a summing amplifier 313 and a switch 314. A 2KHz oscillator 315 delivers sine and cosine output signals to switches 316 and 317 respectively. The switches 316 and 317 are controlled in alternation with the switches 312 and 314 by a signal from the computer 23 on a line 318 which is connected to the switches 312 and 314 by way of an inverting amplifier 319. Each of the switches 312, 314, 316 and 317 may be a field effect transistor analogue switch. The signal on the line 318 normally holds the switches 312 and 314 open (on) to allow control of the secondary deflection and the switches 316 and 317 are closed (off). When the activating beam is not required to effect activation of the photochromic film a "beam idle" signal on the line 318 closes (shut off) the switches 312 and 314 and opens (turns on) the switches 316 and 317 to apply the sine and cosine signals from the oscillator to the X and Y secondary deflection circuits, thus causing the beam to execute a small circular movement. The diameter of the circle is such that the beam does not pass through the aperture in the diaphragm, which thus acts as a shutter. This is necessary because the modulator 19, though having a large ratio of some 500 to 1 between the maximum and minimum intensities transmitted, is not capable of complete extinction of the beam.

The summing amplifiers 311 and 313 in FIG. 4 allow the overall control of the deflection by the deflection control system to be supplemented by a localised control effected by the secondary deflection system alone. Inputs on lines 320 and 321 effect this supplementary control of the secondary deflection system 11 and, in particular, the raster scan circuit 24 is connected to either the line 320 or the line 321 to effect scanning in either the X direction or the Y direction.

In the apparatus described the photochromic film is placed in front of the record. If the record is on paper or other non-transparent medium but still in the form of lighter lines on a darker background, it can be scanned by refelcted light and the photochromic film must be placed in front of it. In the case of a film record in which the lines are transparent it is possible to place the photochromic film behind the record and in this case the record must be such that the activating beam as well as the monitoring beam is transmitted more by the lines than by the background.

Other photo-sensitive materials may be used in place of the photochromic film, for example, liquid crystal materials, provided that they can be changed in color or intensity by an activating beam but are not affected by radiation of other wavelengths. in all cases the projection beam or other light used for viewing must, of course, lie outside the range of wavelengths which activate the photochromic material and if necessary these wavelengths can be filtered out.

In particular example of the application of the method in accordance with the invention the film record is on diazo film, which typically develops as clear transparent lines on a dark blue or magenta background. An orange photochromic film, consisting of a homogeneous solution of a mercury complex in a polymer coated on to a trasnsparent polymer support sheet, is placed over the diazo film. In the projected image the lines of the record appear orange. The monnitoring beam is a beam of wavelength 6471 A. from a mixed Argon-Krypton gas laser or of wavelength 6328A. from a Helium-Neon laser. This beam is transmitted by the lines of the diazo film record and by the photochromic film without activating the latter. The activating beam is a beam of wavelength 4880A. which is derived from the Argon-Krypton laser or from a separate Argon laser. This activates the photochromic film to a deep blue-grey/black color which absorbs the monitoring beam. The lines traced by the activating beam then appear as darker lines on the dark background of the projected image.

It would be possible to design a completely automatic machine in which the photosensor only responded to the monitoring beam transmitted by lines not previously read and at intervals along the line or at intersections the machine automatically switched over to the actuating beam to trace the lines previously read. This however would require complex control programs in the computer and would be unduly expensive. At the other end of the scale the operation could be entirely operator-controlled. The operator would move the monitoring beam to points in the track and read off the co-ordinates, periodically going back over the track and tracing it with the actitvating beam.

However, the preferred system is a semi-automatic one in which the operator initially positions the monitoring beam over a feature of the record and then initiates automatic scanning of that feature. The swiitchover to the actuating beam can be manual or automatic but the tracing of the feature which has been read will be automatically controlled in accordance with the line position information stored in the computer. The operator can then intervene again to move the monitoring beam to another feature which has not yet been read.

I claim:
1. In a method of reading a record by means of a monitoring beam which is transmitted or reflected by the lines of the record more than by the background, the improvement comprising the steps of placing a sheet of photo-sensitive material against the record, receiving with a monitoring beam which does not affect the photo-sensitive material, and after each line or part line of the record has been read, tracing said line or part-line with an activating beam which activates the photo-sensitive material, whereby lines which have been read can be differentiated from those which have not.

2. In a method as claimed in claim 1 and as part of said reading step, scanning the monitoring beam over an area of the record to be read, and detecting the position of a record line in the scan by means of a photo-sensor while rendering said activating beam inoperative.

3. In a method as claimed in claim 1,
modulating the activating beam in accordance with the velocity of tracing to activate points at equal intervals along the trace.

4. In a method as claimed in claim 1, obtaining line position information by said reading of the record with said monitoring beam and storing such line position information, and controlling said tracing with the ac.. vating beam in accordance with the stored line position information.

5. In a method as claimed in claim 1,
illuminating the combination of the record and the photo-sensitive material for observation by an operator by means of a light beam filtered to remove wavelengths to which the photo-sensitive material is responsive.

6. In a method as claimed in claim 1,
deflecting the monitoring beam and the activating beam with the same deflection system.

7. A method according to claim 1 in which said reading step includes scanning the monitoring beam over an area of the record to be read, detecting crossing of a record line by such monitoring beam with a photo-sensor, utilizing the photo-sensor output to store data indicating the position of the scan line, such reading step being carried out with an activating beam in an inoperative condition, said tracing step including controlling the positioning of the activating beam in accord with the stored line position data, said method including further the routing of said monitoring beam and activating beam through a common beam deflection system.

8. In apparatus for reading a record by means of a steered monitoring beam which is transmitted or reflected by the lines of the record more than by the background, the improvement comprising, means for supporting a sheet of photo-sensitive material adjacent the record, means for generating an activating beam capable of activating said photo-sensitive material means for storing line position information obtained by the reading operation, and means for steering said activating beam under the control of said stored position information to trace a line or part line of the record which has been read and thereby activate that part of the photosensitive material adjacent the read line or part line of the record, whereby the said line or part line which has been read can be distinguished from the lines which have not.

9. In reading apparatus as claimed in claim 8,
means for modulating the activating beam in accordance with the velocity of tracing to activate points at equal intervals along the line.

10. In reading apparatus as claimed in claim 8,
means for illuminating the combination of the record and the photo-sensitive material with a light beam having only wavelengths to which the photo-sensitive material is not responsive, and
means for observing the said combination in the said light beam.

11. In reading apparatus as claimed in claim 8,
said steering means also being disposed in the path of the monitoring beam to also effect deflection of the monitoring beam for reading.

12. In reading apparatus as claimed in claim 11,
said steering means comprising main and auxiliary deflectors, a deflection control circuit applying an error signal to both main and auxiliary deflectors, said auxiliary deflectors providing small, high-speed correcting movements, and a raster scan circuit connected to the auxiliary deflectors to superimpose a line scan on the movement of the monitoring beam across the record.

13. In reading apparatus as claimed in claim 12,
photo-sensing means constructed and arranged to detect the monitoring beam after transmission by or reflection from a line of the record, and
a counting circuit connected to said photo-sensing means and to said raster scan circuit to determine the position of the record line in the scan.

14. The reading apparatus of claim 13, in which said counting circuit includes squaring logic means for converting pulses from said photo-sensing means into square pulses, a counter reset to zero by said raster scan circuit at the beginning of each line of scan, a stop flip-flop correspondingly reset, gate means responsive to a series or pulses from said raster scan circuit commencing at the beginning of each scan line; means coupling said squaring logic means to said gate means and responsive to the front edge of a square pulse from said squaring logic means for halving the rate at which pulses are applied by said gate means to said counter, means connecting said stop flip-flop to said squaring logic means and responsive to the trailing edge of the squared pulse from said squaring logic means for causing said stop flip-flop to inhibit said gate means and thereby stop counting of pulses by said counter, wherein the resulting count in the counter represents the position of the midpoint of the line crossed by the scanning beam.

15. The reading apparatus of claim 12 in which said deflection control circuit includes a shutter drive oscillator providing sine and cosine signals, switch means actuable for passing said sine and cosine signals to means for orbiting said activating beam about its normal operative position, and a diaphragm having an opening therethrough along said normal activating beam position but which blocks said beam when the latter is orbited.

* * * * *

UNITED STATES PATENT OFFICE
CERTIFICATE OF CORRECTION

Patent No. 3,988,610          Dated October 26, 1976

Inventor(s) Graham Stewart Brandon Street

It is certified that error appears in the above-identified patent and that said Letters Patent are hereby corrected as shown below:

Column 8, line 34; change "receiving with" to ---reading with---.

line 55; should read "with the acti-".

Signed and Sealed this

Twenty-second Day of February 1977

[SEAL]

Attest:

RUTH C. MASON          C. MARSHALL DANN
*Attesting Officer*          *Commissioner of Patents and Trademarks*